(12) United States Patent
van Nee

(10) Patent No.: US 9,008,199 B2
(45) Date of Patent: Apr. 14, 2015

(54) ADVANCED MIMO INTERLEAVING

(75) Inventor: D. J. Richard van Nee, De Meern (NL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/492,674

(22) Filed: Jun. 26, 2009

(65) Prior Publication Data

US 2009/0323850 A1    Dec. 31, 2009

Related U.S. Application Data

(63) Continuation of application No. 11/173,177, filed on Jul. 1, 2005, now Pat. No. 7,570,697.

(60) Provisional application No. 60/585,246, filed on Jul. 1, 2004, provisional application No. 60/589,390, filed on Jul. 19, 2004, provisional application No. 60/600,962, filed on Aug. 11, 2004.

(51) Int. Cl.
| | |
|---|---|
| *H04K 1/10* | (2006.01) |
| *H04L 27/18* | (2006.01) |
| *H04L 1/00* | (2006.01) |
| *H03M 13/27* | (2006.01) |
| *H04B 7/04* | (2006.01) |

(Continued)

(52) U.S. Cl.
CPC ......... *H04L 1/0071* (2013.01); *H03M 13/2757* (2013.01); *H04B 7/04* (2013.01); *H04L 1/0041* (2013.01); *H04L 1/06* (2013.01); *H04L 1/0656* (2013.01); *H04L 27/2601* (2013.01); *H04L 27/2602* (2013.01)

(58) Field of Classification Search
CPC .............. H04L 27/2647; H04L 5/0007; H04L 27/2657; H04L 27/2662; H04L 5/0048; H04L 1/0618; H04L 1/06; H04L 25/0204; H04L 27/361; H04L 27/02; H04L 27/2071; H04L 27/389; H04L 27/10; H04L 1/0071; H04B 7/0417; H04B 7/0669; H04B 7/0845; H04B 7/0854; H04B 7/0857; H03M 13/276; H03M 13/2764; H03M 13/2732; H03M 13/2771
USPC .......... 375/260, 267, 299, 347; 455/101, 504, 455/506; 714/702
See application file for complete search history.

(56) References Cited

U.S. PATENT DOCUMENTS 6,973,611 B2 * 12/2005 Dabak et al. .................. 714/755
7,260,366 B2    8/2007 Lee et al.
(Continued)

FOREIGN PATENT DOCUMENTS

| EP | 0674455 | 9/1995 |
|---|---|---|
| JP | 2003087191 A | 3/2003 |

(Continued)

OTHER PUBLICATIONS

International Search Report—PCT/US05/023594, International Search Authority—European Patent Office, Nov. 8, 2005.

(Continued)

*Primary Examiner* — Phuong Phu
(74) *Attorney, Agent, or Firm* — Howard Seo

(57) ABSTRACT

A MIMO transmitter including an interleaving system for parsing encoded bits to a plurality of spatial streams and a plurality of interleavers to interleave bits for spatial streams such that at least a first spatial stream uses a first stream interleaver that interleaves with a pattern distinct from a second stream interleaver interleaving for a second spatial stream.

18 Claims, 17 Drawing Sheets

(51) Int. Cl.
*H04L 1/06* (2006.01)
*H04L 27/26* (2006.01)

(56) References Cited

U.S. PATENT DOCUMENTS

| | | | |
|---|---|---|---|
| 7,418,042 B2 | 8/2008 | Choi et al. | |
| 7,570,697 B2 | 8/2009 | Van Nee et al. | |
| 2003/0072393 A1* | 4/2003 | Gu | 375/322 |
| 2003/0103584 A1* | 6/2003 | Bjerke et al. | 375/340 |
| 2003/0235147 A1 | 12/2003 | Walton et al. | |
| 2004/0081073 A1* | 4/2004 | Walton et al. | 370/204 |
| 2005/0111347 A1 | 5/2005 | Breiling et al. | |
| 2005/0159115 A1 | 7/2005 | Sandhu | |
| 2005/0243774 A1* | 11/2005 | Choi et al. | 370/335 |

FOREIGN PATENT DOCUMENTS

| | | |
|---|---|---|
| JP | 2006135978 A | 5/2006 |
| WO | 0033559 | 6/2000 |
| WO | WO03096599 A1 | 11/2003 |

OTHER PUBLICATIONS

Written Opinion PCT/US2005/023594, International Search Authority European Patent Office, Jan. 1, 2007.

"IEEE Std 802.11a—1999—Part 11: Wireless LAN Medium Access Control (MAC) and Physical Layer (PHY) Specifications; High-Speed Physical Layer in the 5 GHz Band" IEEE Standard 802.11A, Jun. 2003, p. 1-83.

Bauch G et al., "Parameter Optimization, Interleaving and Multiple Access in OFDM with Cyclic Delay Diversity", Vehicular Technology Conference, IEEE 59th Milan, Italy May 17-19, 2004, pp. 505-509, vol. 11, Piscataway, NJ, USA, IEEE, US, XP0-7803-8255-2.

Song, K.B., et al., "Rate-compatible punctured convolutionally (RCPC) space-frequency bit-interleaved coded modulation (SF-BICM)", Communications, 2004 IEEE International Conference on, Jun. 2004, vol. 6, pp. 3284-3288.

Kee-Bong Song et al., "A Low Complexity Space-Frequency BICM MIMO-OFDM System for Next-Generation WLANs" Global Telecommunications Conference, 2003. GLOBECOM '03. IEEE, Dec. 5, 2003, vol. 2, pp. 1059-1063.

Y. Murakami, et al., Varying Interleave Patterns with Interactive Decoding Using Signal Points Reduction in MIMO Systems, Technical Report of IEICE, Japan, The Institute of Electronics, Information and Communication Engineers, Apr. 2004, vol. 104, No. 21, pp. 41-46.

* cited by examiner

ADVANCED MIMO INTERLEAVING

CROSS-REFERENCE TO RELATED APPLICATIONS

This application is a continuation of U.S. application Ser. No. 11/173,177 filed Jul. 1, 2005 now U.S. Pat. No. 7,570,697 entitled, "ADVANCED MIMO INTERLEAVING," which claims benefit of U.S. Provisional Patent Application Nos. 60/585,246 filed Jul. 1, 2004, entitled, "MIMO INTERLEAVING," 60/589,390 filed Jul. 19, 2004, entitled, "ADVANCED MIMO INTERLEAVING," and 60/600,962 filed Aug. 11, 2004, entitled, "ADVANCED MIMO INTERLEAVING," which are hereby incorporated by reference, as if set forth in full in this document, for all purposes.

BACKGROUND OF THE INVENTION

Wireless networks have become increasingly popular, as computers and other devices can be coupled for data communications without requiring wired connections between the network nodes. Because wireless networks are expected to operate in unfavorable conditions, such as in the presence of reflections, interference, movement of receivers/transmitters, etc., much effort is needed to correctly transmit and receive data over a wireless channel.

A typical node in a wireless network (referred to in the standards as a "station") includes a receive chain and a transmit chain. A transmit chain typically includes some digital processing and analog circuitry (RF, baseband, etc.) that causes a signal to be transmitted into the wireless channel. A receive chain typically includes one or more antenna, RF circuitry and other analog circuitry, and digital processing that seeks to output a data stream that represents what the sending transmit chain received as its input and transmitted into the wireless network. Of course, where there are unrecoverable errors, there is a mismatch between what the sending transmit chain received and what the receiving receive chain outputs. In some cases, a receiver uses multiple antennas to improve reception of the signal from a sending transmit chain.

Because of the expected conditions, the receive chain includes various components designed to ensure that signals can be largely recovered correctly. Several techniques have been in use to recover signals. One technique is the use of error correction. With error correction, when a bit or bits are lost, they might be recovered using other bits that were not lost according to whatever error correction coding was done. Error correction cannot correct all errors, so even some error conditions might cause unrecoverable errors. For example, if four information bits are encoded into seven transmitted bits using a Reed-Solomon error correcting encoding, if any four of the seven transmitted bits are recovered, then the four information bits can be determined. However, if more than three of the transmitted bits are lost, the full information cannot be recovered. Note that if there are several such encodings, information is lost when four bits are lost if they all are lost out of one encoding, but if four bits are lost with two bits lost per encoding, the information is recoverable.

One approach to spreading potential losses is interleaving. A standard 802.11a transmitter interleaves bits over subcarriers.

Interleaving is useful to distribute bits so that errors can be recovered in the face of fading and other channel conditions. In an 802.11a interleaver, the bits are as reordered as shown below, wherein $N_{BPSC}$ refers to the number of coded bits per subcarrier, $N_{CBPS}$ refers to the number of coded bits per OFDM symbol and $N_{DBPS}$ refers to the number of data bits per OFDM symbol.

$$i=(N_{CBPS}/16)(k \bmod 16)+\text{floor}(k/16) \text{ for } k=0,\ldots,N_{CBPS}-1 \quad \text{(Equ. 1)}$$

$$j=s\,\text{floor}(i/s)+(i+N_{CBPS}-\text{floor}(16*i/N_{CBPS}))\bmod s,$$
$$\text{where } s=\max(N_{BPSC}/2,1) \quad \text{(Equ. 2)}$$

Thus, an interleaver would take in coded bits in an input sequence from an encoder wherein the coded bits have indices represent by k (i.e., the bits arrive as k=0, k=1, k=2, etc.). The interleaver reorders them so that the bits are output in order by their j index. For a given value of k, the value of j is determined by the formula of Equations 1-2. Using this arrangement, adjacent bits are separated such that they differ by three subcarriers and next adjacent bits differ by six subcarriers. There are 16 bits of difference within a given subcarrier (for QPSK or higher order constellations).

However, interleavers can be improved over the standard 802.11a interleaver.

A MIMO (multiple-input, multiple-output) system comprises at least a transmitter that transmits a number of bits, or a stream of bits, over a transmission medium to a receiver. Typically, the transmission medium is a wireless radio channel but the other media such as multi-mode fiber might be used instead. A MIMO system comprises M transmit streams and N receive antennas (spatially separated, separated by polarization, or otherwise separated), where M and N are each integers greater than one (except for degenerate cases of M=1 and/or N=1, wherein MIMO techniques would work, but not provide as much benefit). Thus, an MIMO transmitter transmits its data as M streams and a receiver processes its inputs as N inputs.

A MIMO transmitter might comprise an encoder that first applies a forward error correcting (FEC) code on the bit stream that is to be received at an output of the receiver. The FEC code could be a block code, a convolution code or other code or codes. The coded bit stream is distributed by a demultiplexer over M transmit streams. Many of the examples herein use M=2 as an example, but it should be understood that the examples can be expanded to other values of M. The same is true for N, and M and N need not be the same value. In any case, the distributed, coded transmit streams are modulated and transmitted. As an example, bits for a transmit stream might be divided in groups of two bits and modulated onto a carrier using QPSK (Quaternary Phase Shift Keying) modulation. More or less advanced modulation techniques are possible, such as BPSK (mapping one bit at a time), 16-QAM (mapping groups of four bits), 64-QAM (mapping groups of six bits), etc.

In general, for a transmit constellation size of c, a MIMO transmitter transmits M·(log 2 c) coded bits per symbol period ($N_{CBPS}$). The transmit symbols for a symbol period can be represented as an M-dimensional vector x. These symbols are up-converted to radio frequency, transmitted and then received by N antennas at the receiver. The receiver converts the signal down to baseband frequency and, at the output of the N down-converters. Those received symbols can be represented by an N-dimensional vector y. An example of a transmitter-receiver system is shown in FIG. 1.

For MIMO systems, interleavers might be needed with better performance than standard 802.11a interleavers.

BRIEF SUMMARY OF THE INVENTION

An improved interleaver is provided as set forth herein. In one aspect, enhanced interleaving gain is provided with the improved interleaver. The improved gain can result from increasing distances between adjacent bits or next adjacent bits, or both. Since adjacent tones see similar fading, interleaving data bits on tones that are more separated results in better performance. With more separation, the error correction is more capable of correcting bits that are surrounded by good bits.

In some embodiments, the bits that are encoded into a MIMO symbol are such that at least a majority of adjacent pairs of bit are mapped to different subcarriers and different spatial streams. In some implementations, an output of an encoder is provided to a parser that parses the encoder output stream to a plurality of spatial streams and per-stream interleavers interleave the parsed streams, wherein the interleavers for each spatial stream follow different interleaver processes.

In some cases, where there is n-bit cycling, every group of n bits is mapped onto different subcarriers and different spatial streams.

The following detailed description together with the accompanying drawings will provide a better understanding of the nature and advantages of the present invention.

DETAILED DESCRIPTION OF THE INVENTION

Figure 1:
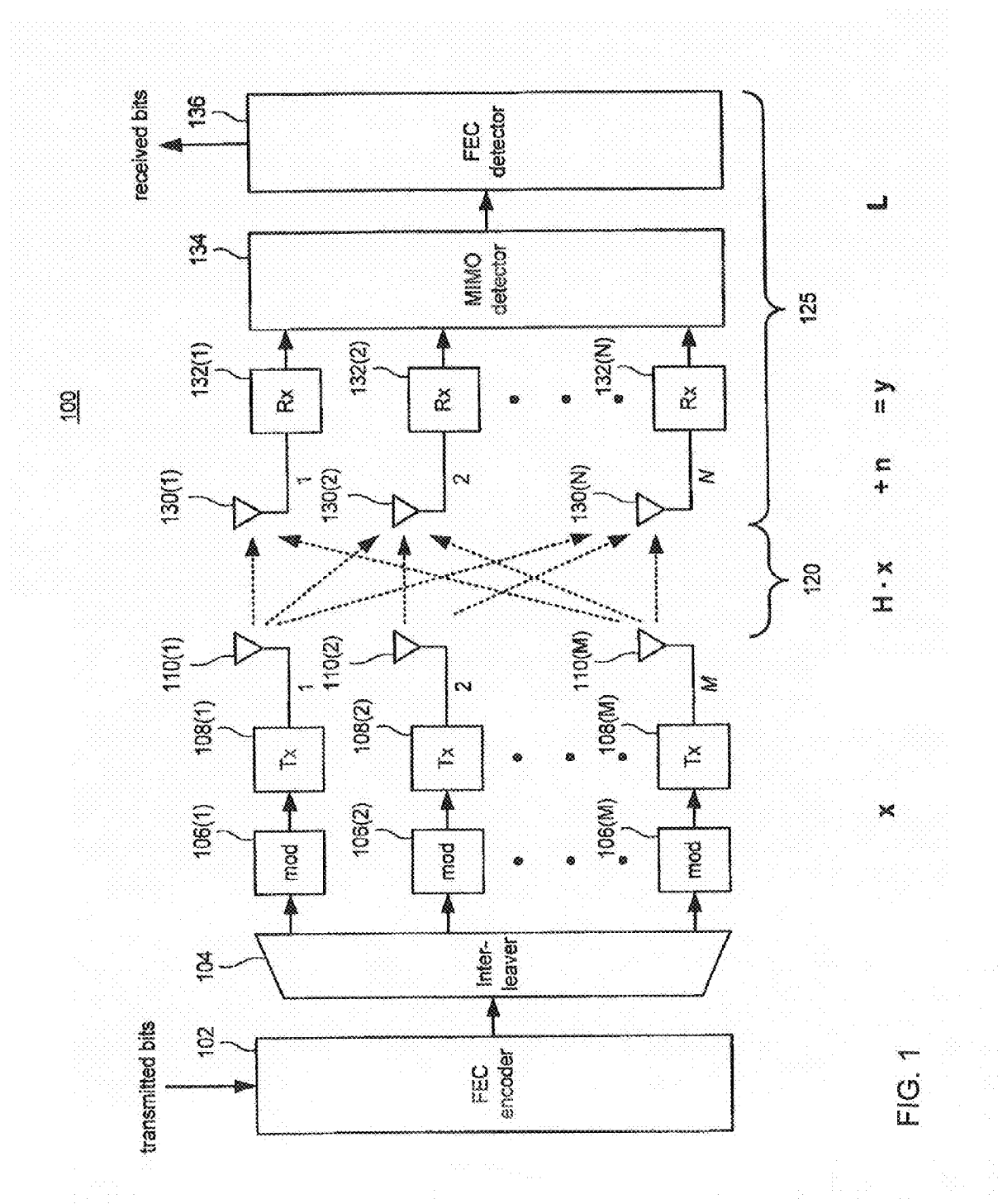
FIG. 1 is a block diagram of a MIMO system in which aspects of the present invention might be used.

In embodiments of a transmitter according to aspects of the present invention, MIMO interleaving is used wherein adjacent bits are well separated in subcarrier and spatial stream. Generalized 802.11a MIMO Symbol Interleaving The following abbreviations are used herein:

$N_{DBPS}$: Total number of data bits per OFDM/MIMO symbol over all TX $N_{CBPS}$: Total number of coded bits per OFDM/MIMO symbol over all TX $N_{BPSC}$: Number of coded bits for one subcarrier of one transmitter $N_{TX}$: Number of transmitters/spatial streams $I_{DEPTH}$: Interleaving depth ($I_{DEPTH}$=16 for 802.11a)

$D_n$: Shift in subcarriers for transmitter/spatial stream (TX) n $j_n$: interleaver index for TX n within its block of $N_{CBPS}/N_{TX}$ bits $k_n$: Input bit index for TX n $$k_n = N_{TX}k + n \; n=0, \ldots, N_{TX}-1$$

$$i = ((N_{CBPS}/N_{TX})/I_{DEPTH})(k \bmod I_{DEPTH}) + \text{floor}(k/I_{DEPTH}) \; k=0, \ldots, (N_{CBPS}/N_{TX})-1$$

$$j = s \, \text{floor}(i/s) + (i + N_{CBPS}/N_{TX} - \text{floor}(I_{DEPTH}*i/(N_{CBPS}/N_{TX}))) \bmod s \text{ where } s = \max(N_{BPSC}/2, 1)$$

$$j_n = (j + N_{CBPS}/N_{TX} - 2s*D_n) \bmod (N_{CBPS}/N_{TX})$$

In general, an encoder consumes $N_{DBPS}$ bits per cycle, wherein a cycle is a time period for sending a signal. Using the terminology above, $N_{CBPS}$ refers to the number of coded bits per symbol overall, so $N_{DBPS}/N_{CBPS}$ is the code rate. Using the terminology above, $N_{BPSC}$ refers to the number of coded bits per subcarrier, so $N_{CBPS}=N_{BPSC}*S*N_{TX}$ where S is the number of subcarriers used for each transmitter/spatial stream (assuming the same number of subcarriers per stream and the same number of coded bits per subcarrier, which need not be the case).

Thus, for a standard 802.11a interleaver:

$$I_{DEPTH}=16, N_{TX}=1 \quad \text{(Equ. 3)}$$

$$i = ((N_{CBPS}/16)(k \bmod 16) + \text{floor}(k/16) \\ k=0, \ldots, N_{CBPS}-1 \quad \text{(Equ. 4)}$$

$$j = s \, \text{floor}(i/s) + (i + N_{CBPS} - \text{floor}(16*i/N_{CBPS})) \bmod s, \\ \text{where } s = \max(N_{BPSC}/2, 1) \quad \text{(Equ. 5)}$$

Thus, an interleaver would take in coded bits in an input sequence from an encoder wherein the coded bits have indices represent by k (i.e., the bits arrive as k=0, k=1, k=2, etc.). The interleaver reorders them so that the bits are output in order by their j index. For a given value of k, the value of j is determined by the formula of Equations 3-5. Using this arrangement, adjacent bits are separated such that they differ by three subcarriers and next adjacent bits differ by six subcarriers. There are 16 bits of difference within a given subcarrier (for QPSK or higher order constellations).

For examples herein, there are separated sequences for different spatial streams, denoted with $j_n$. In a specific example, k is an input bit index for each spatial stream interleaver and where 48 subcarriers with BPSK is used, k=0, 1, . . . , 47 and $j_n$ is the interleaving index, for each spatial stream, input bit number k is output as bit number $j_n$. In other words if k=0, 1, 2, . . . is input, an $j_n$=0, 6, 12, . . . , then bit 0 of the input is bit 0 of the output, bit 1 of the input is bit 6 of the output, and so on.

Alternative Implementation

In the above-described scheme, instead of $j_n=(j+N_{CBPS}/N_{TX}-2s*D_n) \bmod (N_{CBPS}/N_{TX})$, it is possible to use $N_{BPSC}$ instead of 2s, so that $j_n=(j+N_{CBPS}/N_{TX}-N_{BPSC}*D_n) \bmod (N_{CBPS}/N_{TX})$. For QPSK, 16-QAM, and 64-QAM, 2s is identical to $N_{BPSC}$, but for BPSK, this makes a difference. For BPSK, $N_{BPSC}$=1 and 2s=2, so the difference in this case between the two alternatives is that the first one effectively doubles the subcarrier shift $D_n$ relative to the second alternative. Hence, if for the first alternative, $D_n$ for non-BPSK rates is chosen to be twice as large as $D_n$ for BPSK rates, then the first alternative is equivalent to the second alternative that uses the same $D_n$ for all rates, with $D_n$ being equal to the non-BPSK $D_n$ of the first alternative.

Hardware Implementation

Referring now to the figures, FIG. 1 is a block diagram of a MIMO system 100 in which aspects of the present invention might be used. As illustrated there, bits to be transmitted via a channel are provided to a FEC encoder 102 that applies a forward error correcting code and provides the encoded data to an interleaving system 104 that distributes its input into M transmit streams. Each transmit stream is modulated by a modulator 106 and passed to a transmission circuit 108 that transmits the modulated transmit stream using an antenna 110 into a channel 120, such as a wireless radio space using some frequency band, such as those used for 802.11 transmissions.

In some embodiments, antennas 110 are distinct and spatially separated antennas. In other embodiments, distinct signals might be combined into different polarizations off of fewer than M antennas. An example of this is where spatial rotation or spatial spreading is done, where multiple spatial streams are mapped on a single antenna. In any case, it should be understood that distinct spatial streams can be organized in different manners. For example, a transmit antenna might carry data from more than one spatial stream or several transmit antennas might carry data from a spatial stream. For example, consider the case of a transmitter with four transmit antennas and two spatial streams. Each spatial stream can be mapped onto two transmit antennas in that case, so two antennas are carrying data from just one spatial stream.

A receiver 125 receives signals from channel 120 at N antennas 130 (counting separate polarizations, as appropriate) coupled to N receive circuits 132. The outputs of receive circuits 132 are provided to a MIMO detector 134, which provides its output to a FEC decoder 136, which in turn outputs the received bits which, without unrecoverable errors, are the same as the transmitted bits input to FEC encoder 102. MIMO detector 134 would presumably have the appropriate deinterleaver (not shown).

Vectors and matrices used in various equations described herein have been added below various elements shown in FIG. 1 for ease of understanding correspondence of the elements and the equations set forth here in text. For example, the output of modulators 106 is represented by the vector x and the channel effects are represented by the matrix H. With a noise contribution vector of n, the receiver receives y=Hx+n for processing and from that the receiver determines, as best it is able, what x might have been.

Improved Interleavers

Improved interleavers will now be described that provide improved interleaving, with other variations to be understood upon review of this disclosure. In one improvement, data for a plurality of spatial streams is parsed and interleaved per spatial stream using a different interleaving process between at least two spatial streams.

Transmitter Symbol Interleaving #1

In this interleaver a two transmitter example will be described. In this interleaver, even bits are parsed for a first transmitter TX0 ($k_0$=0, 2, 4, . . . ) and odd bits are parsed for a second transmitter TX1 ($k_1$=1, 3, 5, . . . ). $D_0$=0, $D_1$=8. A separate 802.11a interleaving is done for each transmitter. Then, the indices for transmitter TX1's interleaver are shifted by eight subcarriers to maximize distance between adjacent bits. As with a standard 802.11a interleaver, $I_{DEPTH}$=16. This is shown mathematically by Equations 6-9.

$$i=((N_{CBPS}/2)/16)(k \bmod 16)+\text{floor}(k/16) \quad k=0,\ldots,(N_{CBPS}/2)-1 \tag{Equ. 6}$$

$$j=s\,\text{floor}(i/s)+(i+N_{CBPS}/2-\text{floor}(16*i/(N_{CBPS}/2)))\bmod s \quad \text{where } s=\max(N_{BPSC}/2,1) \tag{Equ. 7}$$

$$j_0=j \tag{Equ. 8}$$

$$j_1=(j+N_{CBPS}/N_{TX}-16s)\bmod(N_{CBPS}/N_{TX}) \tag{Equ. 9}$$

In this arrangement, the bit index for transmitter TX0, $k_0$, is 2k, while the bit index for transmitter TX1, $k_1$, is 2k+1. Thus, one transmitter transmits the odd bits, while the other transmits the even bits.

In this arrangement, adjacent bits differ by eight subcarriers and go to different transmitters, while the next adjacent bits differ by three subcarriers. Adjacent subcarriers differ by 32 bits.

Transmitter Symbol Interleaving #2

In this interleaver a two transmitter example will be described. In this interleaver, even bits are routed for a first transmitter TX0 and odd bits are routed for a second transmitter TX1. A separate 802.11a interleaving is done for each transmitter using eight rows instead of sixteen. Then, the indices for transmitter TX1's interleaver are shifted by eight subcarriers to maximize distance between adjacent bits. This is shown mathematically by Equations 10-13.

$$i=((N_{CBPS}/2)/8)(k \bmod 8)+\text{floor}(k/8) \quad k=0,\ldots,(N_{CBPS}/2)-1 \tag{Equ. 10}$$

$$j=s\,\text{floor}(i/s)+(i+N_{CBPS}/2-\text{floor}(8*i/(N_{CBPS}/2)))\bmod s \quad \text{where } s=\max(N_{BPSC}/2,1) \tag{Equ. 11}$$

$$j_0=j \tag{Equ. 12}$$

$$j_1=(j+N_{CBPS}/N_{TX}-16s)\bmod(N_{CBPS}/N_{TX}) \tag{Equ. 13}$$

In this arrangement, the bit index for transmitter TX0, $k_0$, is 2k, while the bit index for transmitter TX1, $k_1$, is 2k+1. Thus, one transmitter transmits the odd bits, while the other transmits the even bits.

In this arrangement, adjacent bits differ by eight subcarriers and go to different transmitters, while the next adjacent bits differ by six subcarriers. Adjacent subcarriers differ by 16 bits.

Example Implementation Details

Figure 2:
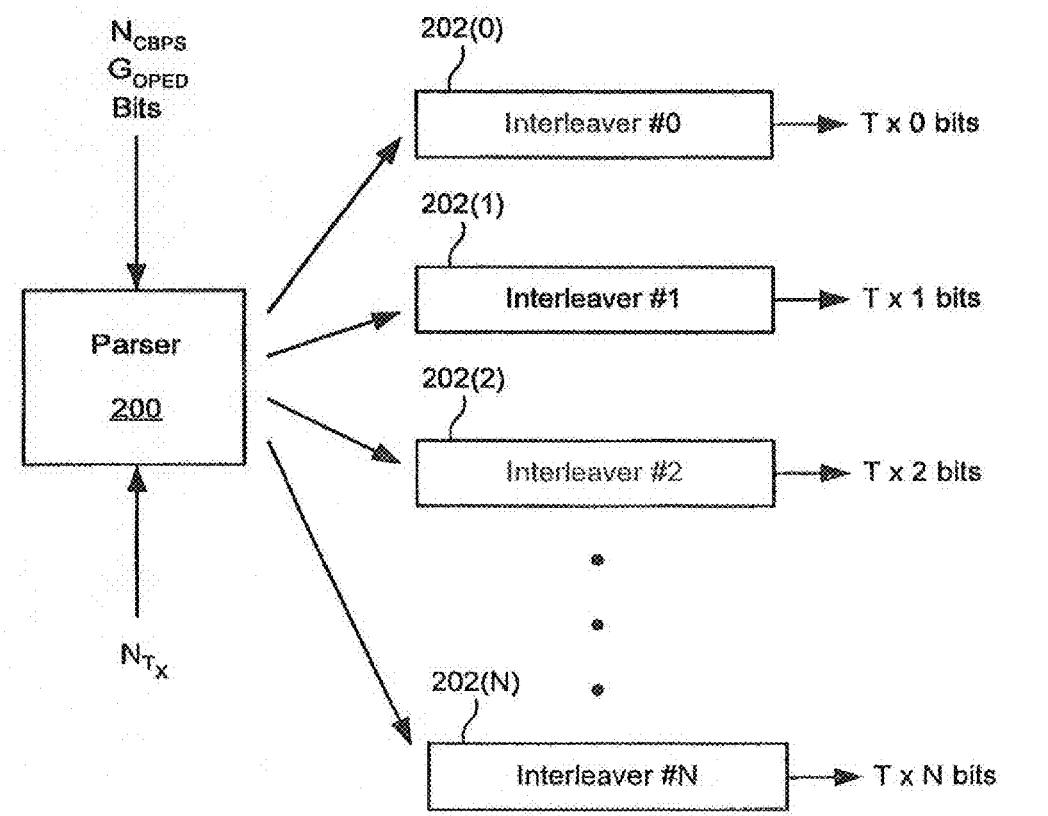
FIG. 2 illustrates an example implementation of a MIMO interleaving system.

FIG. 2 illustrates an example implementation of a MIMO interleaving system. As shown, the input bit stream from an encoder is parsed by parser 200 to a plurality of stream interleavers 202. The parser might be provided with the number of spatial streams and parse bits on a round-robin basis. Other parsings might be used instead, such as parsing more generally using another parsing function. The parsing function for the examples above is $k_n=N_{TX}*k+n$ (i.e., round-robin with one bit per spatial stream, then on to the next spatial stream), but a more general function f(k,n) might be used instead. For example, sending two bits to a spatial stream, then moving to the next spatial stream.

Figure 3:
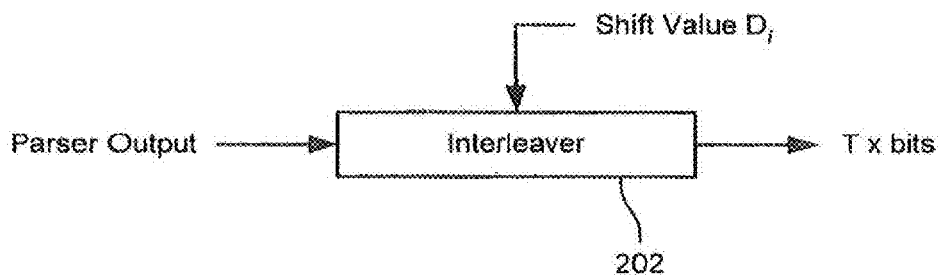
FIG. 3 illustrates an example of a stream interleaver as might be used in the apparatus shown in FIG. 2.

FIG. 3 illustrates an example of a stream interleaver 202 as might be used in the apparatus shown in FIG. 2. In this example, each stream interleaver 202 might be the same, but with different shift values $D_i$. Thus, a four-transmitter MIMO system might use four of the same stream interleavers, but with different cyclic shifts in the subcarriers used. Each stream interleaver might be a conventional 802.11a interleaver.

Figure 4:
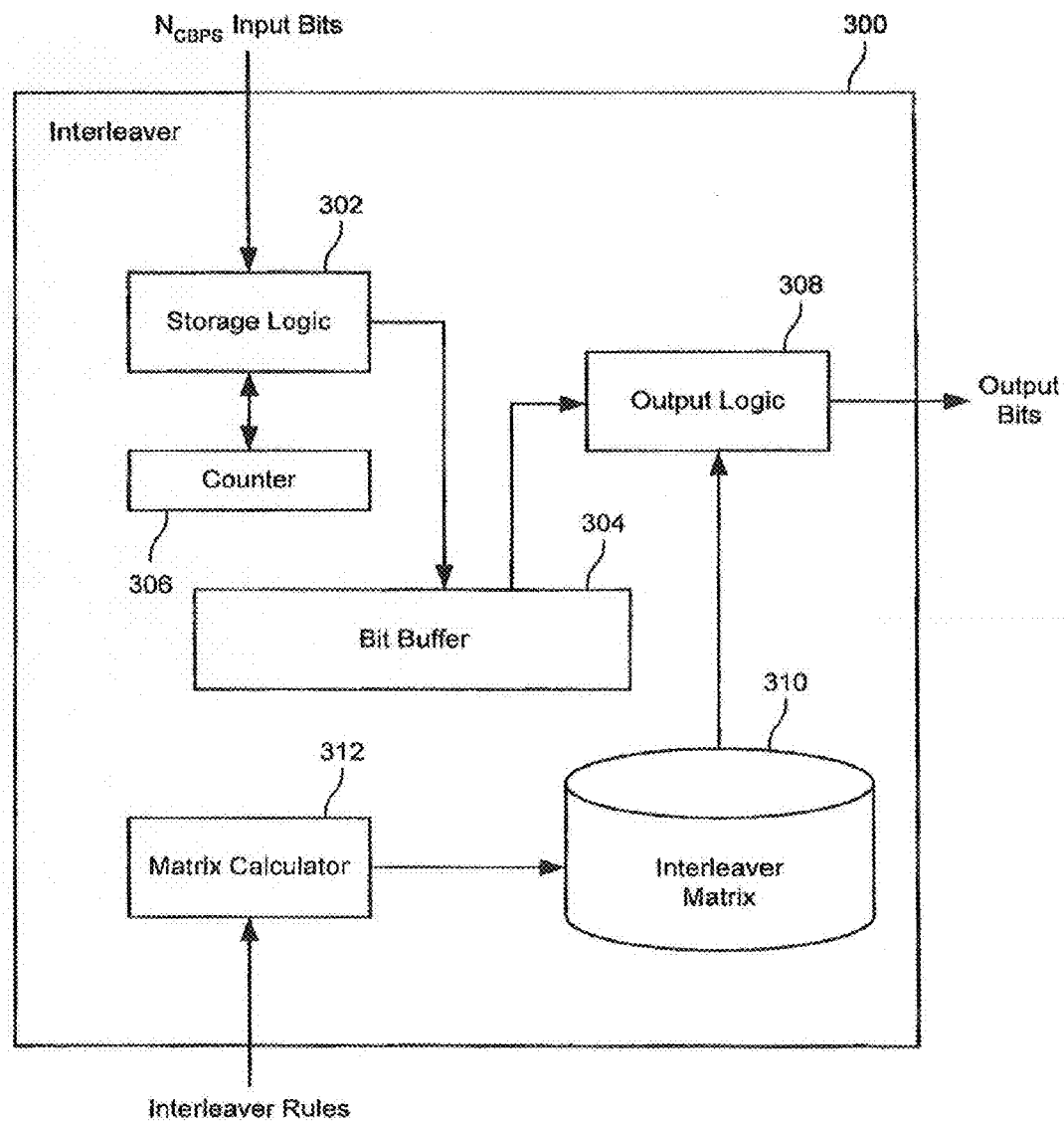
FIG. 4 illustrates an example stream interleaver in greater detail.

FIG. 4 illustrates an example stream interleaver 300 in greater detail. Upon reading this disclosure, it should be apparent to one of ordinary skill in the art that multiple stream interleavers can be combined into a combined structure. As shown, input bits are received and storage logic 302 places the bits in a bit buffer 304. The locations of bit buffer 304 used are dictated by a counter 306 and are typically such that bits are stored sequentially in bit buffer 304, but that is not required. Output logic 308 reads out bits from bit buffer 304 and outputs them. The order in which the bits are read out is determined by the implementation of the interleaver.

The formulas shown in the equations above can be calculated at each bit, but it is often more efficient to calculate all the indices at once and store them as a data structure, such as a matrix mapping input indices to output indices, or just as a list of an output sequence. Such data might be generated using a matrix calculator 312 from interleaver rules.

Interleaving Parameter Selection

Various considerations can be used to select interleaving parameters. FIGS. 5-18 show various results of simulations using various parameters, for 2×2, 3×3, and 4×4 cases. The PER curves are compared to those for 48 subcarriers and for 54 subcarriers. For 54 subcarriers, SNR performance should be about the same for the same coding rate and constellation size. For 108 subcarriers, SNR performance should be as good as or better than for 54 because of extra frequency diversity. The simulations used ideal training, MMSE, 1000 B packets. In the results, SNR is the average SNR per receiver in the signal bandwidth, where signal bandwidth is equal to (number of data tones+number of pilots)/3.2 µs.

Figure 5:
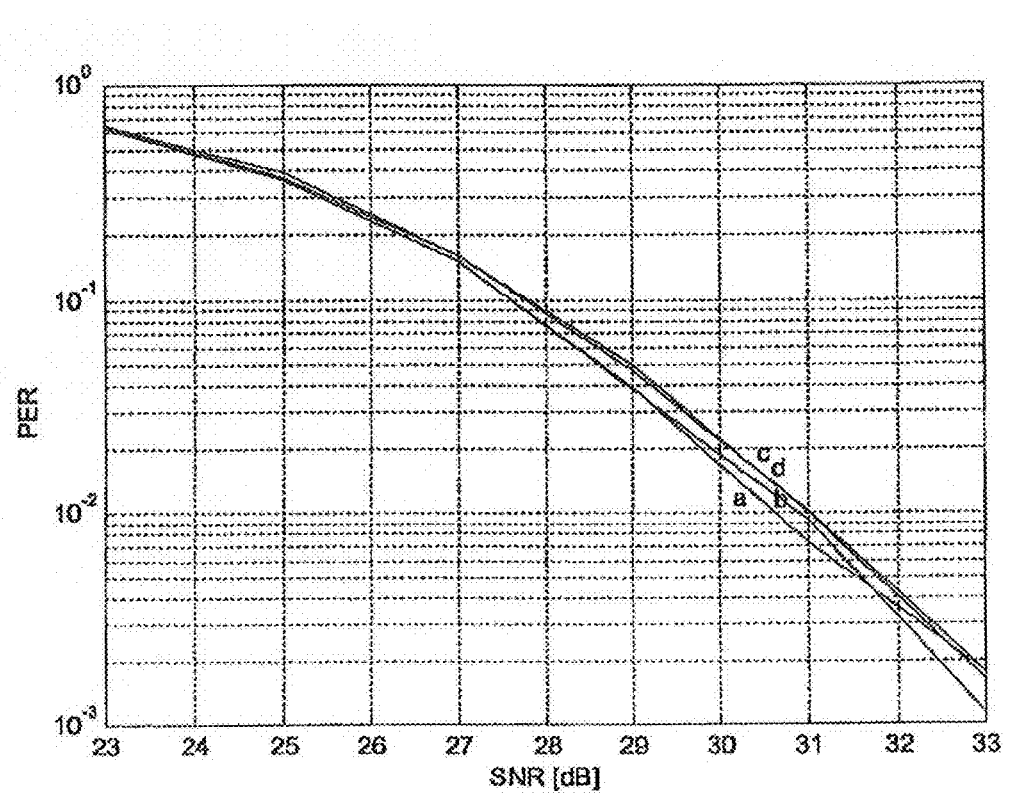
FIG. 5 is a plot of SNR v. PER for various interleaving schemes.

FIG. 5 is a plot of SNR v. PER for various interleaving schemes for 108 Mbps, 2×2, 100 B, Channel C-NLOS. These examples are for two transmitters and two receivers, although other numbers of transmitters and receivers might be contemplated instead. The plot lines of FIG. 5 are:
 a=odd/even TX interleaving, 8 rows
 b=odd/even TX interleaving, 16 rows
 c=odd/even TX interleaving, 16 rows, shift=15

Figure 6:
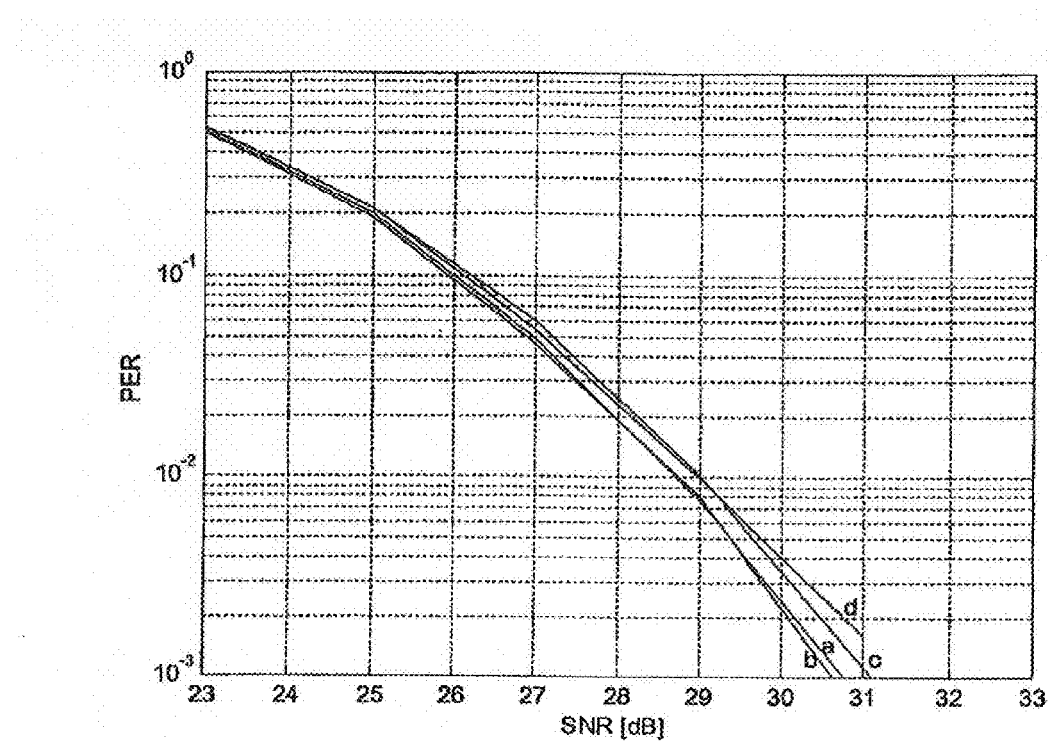
FIG. 6 is a plot of SNR v. PER for various interleaving schemes.

FIG. 6 is a plot of SNR v. PER for various interleaving schemes for 108 Mbps, 2×2, 100 B, Channel D-NLOS, with the plot lines as in FIG. 5.

Figure 7:
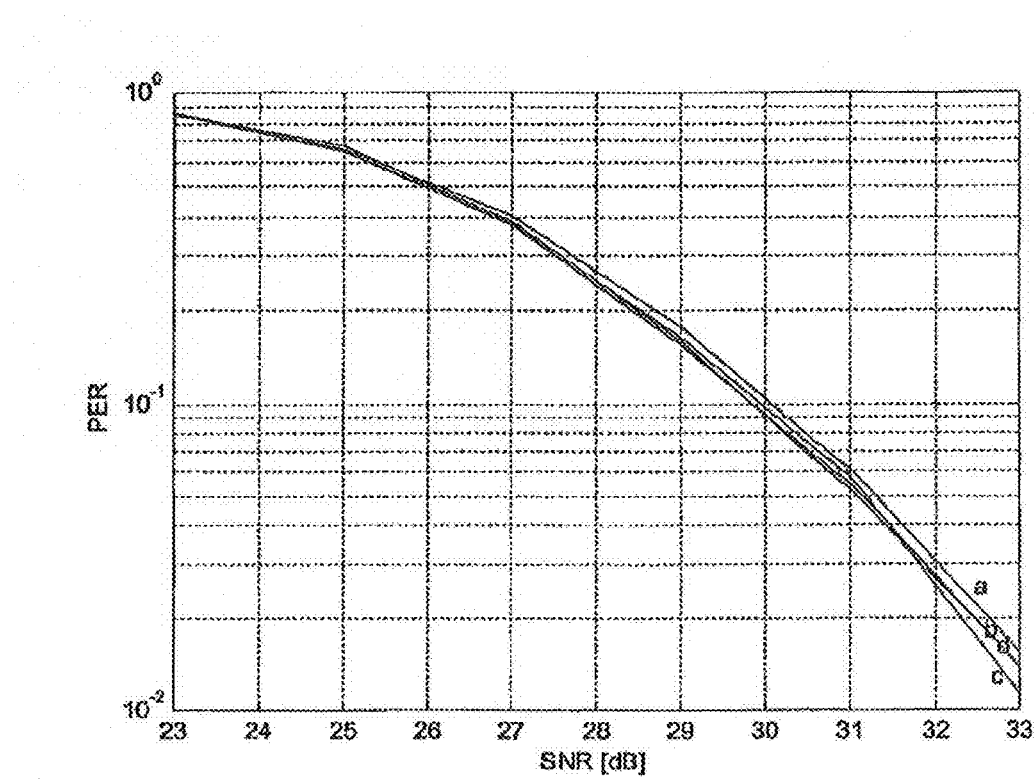
FIG. 7 is a plot of SNR v. PER for various interleaving schemes.

FIG. 7 is a plot of SNR v. PER for various interleaving schemes for 120 Mbps, 2×2, 100 B, Channel C-NLOS, with the plot lines as in FIG. 5.

Figure 8:
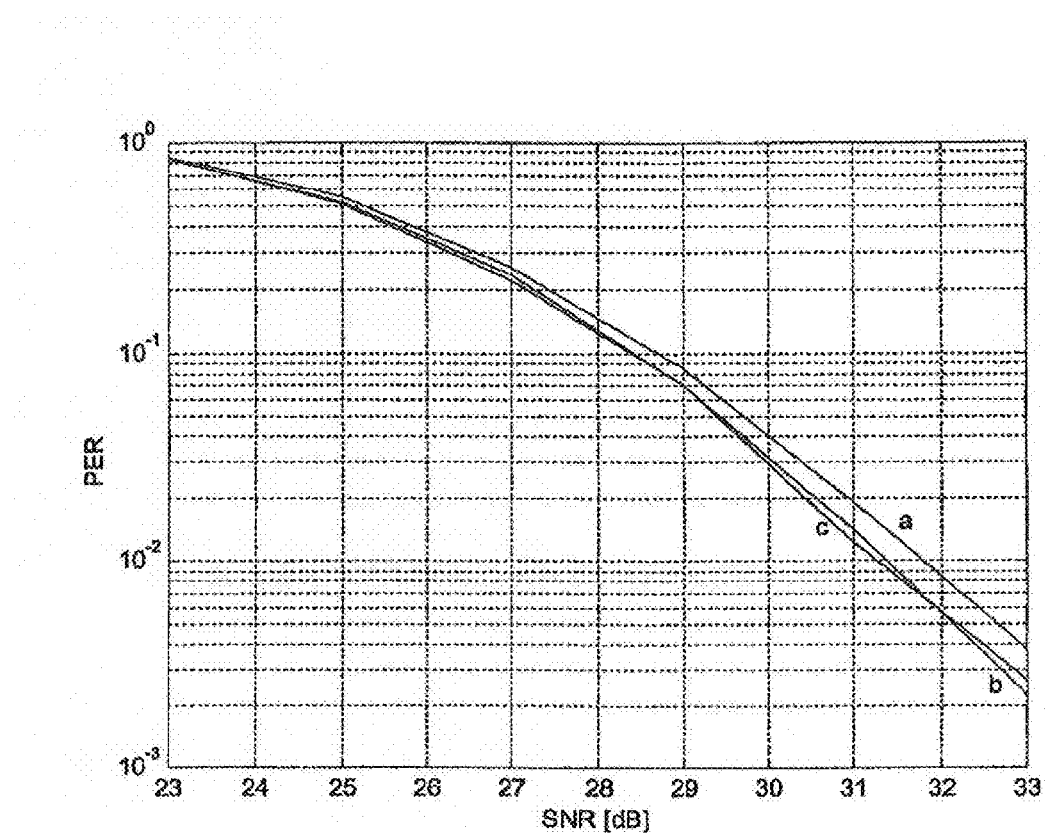
FIG. 8 is a plot of SNR v. PER for various interleaving schemes.
Figure 9:
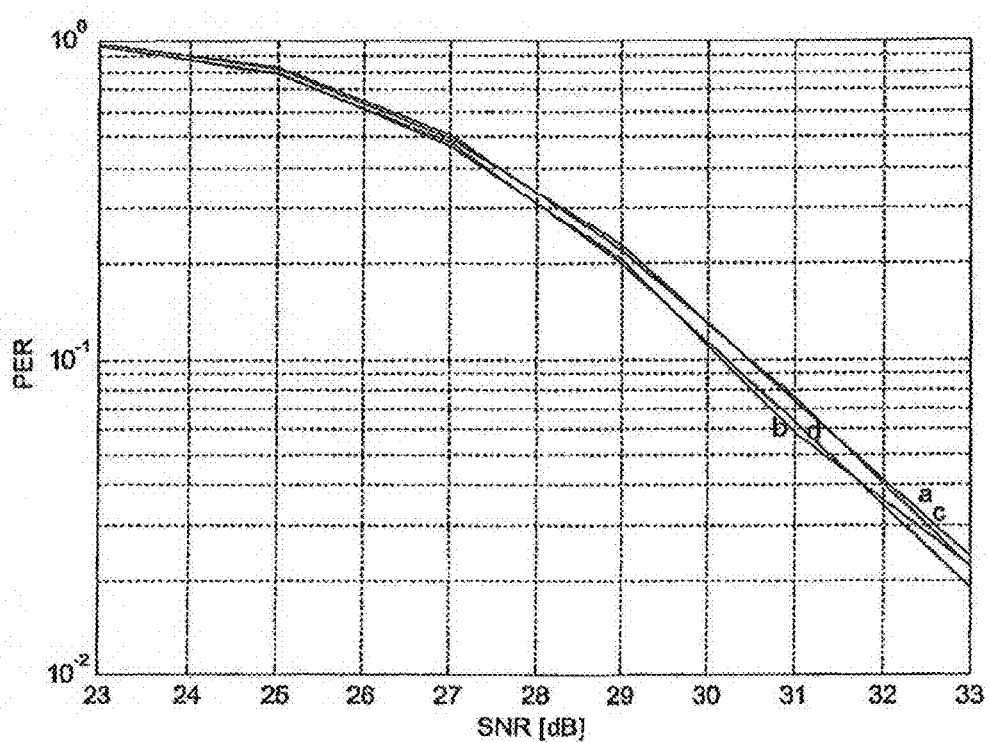
FIG. 9 is a plot of SNR v. PER for various interleaving schemes.

FIG. 8 is a plot of SNR v. PER for various interleaving schemes for 120 Mbps, 2×2, 100 B, Channel D-NLOS. The plot lines of FIG. 5 are:
 a=odd/even TX interleaving, 8 rows
 b=odd/even TX interleaving, 16 rows FIG. 9 is a plot of SNR v. PER for various interleaving schemes for 120 Mbps, 2×2, 100 B, Channel E-NLOS, with the plot lines as in FIG. 5.

Figure 10:
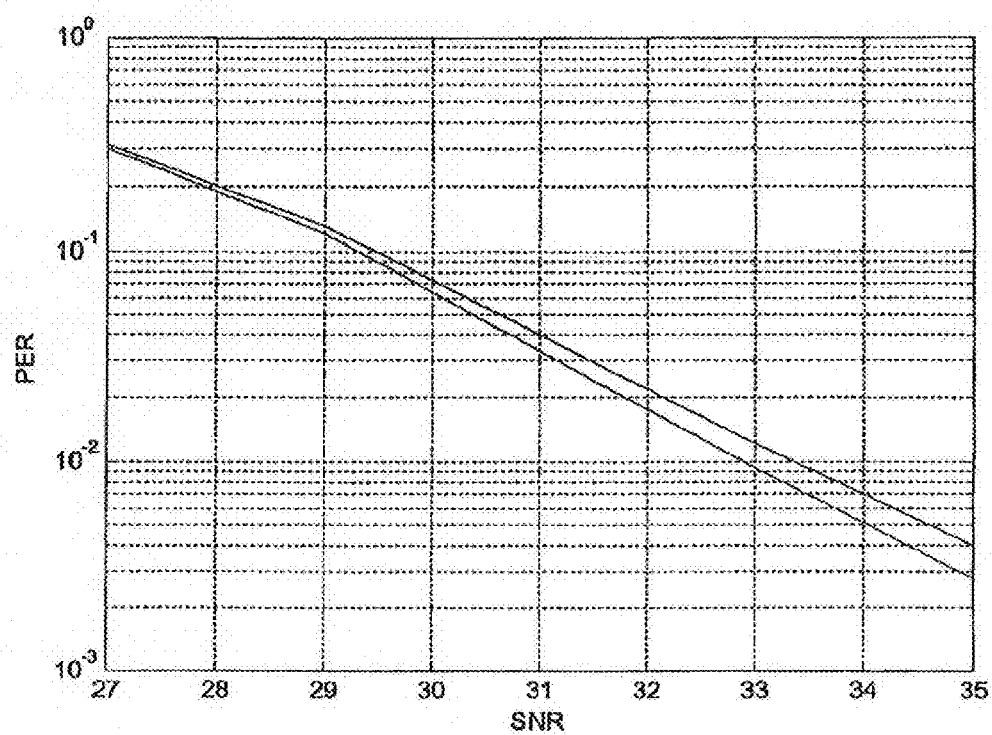
FIG. 10 is a plot of SNR v. PER for various interleaving schemes.

FIG. 10 is a plot of SNR v. PER for various interleaving schemes for 2×2, rate ¾, 64-QAM, Channel D-NLOS, where the upper curve is for 48 subcarriers at 108 Mbps and the lower curve is for 54 subcarriers at 121.5 Mbps.

Figure 11:
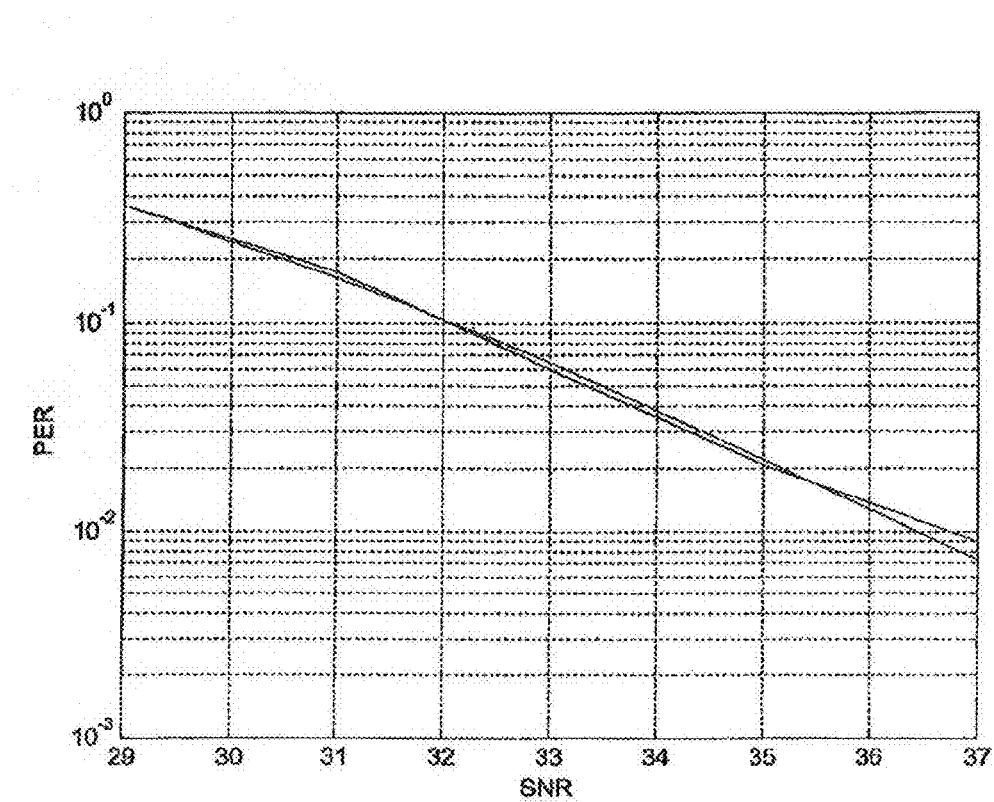
FIG. 11 is a plot of SNR v. PER for various interleaving schemes.

FIG. 11 is a plot of SNR v. PER for various interleaving schemes for 2×2, rate ⅚, 64-QAM, Channel D-NLOS, where the curve that ends at the right as the higher curve is for 48 subcarriers at 120 Mbps and the curve that ends at the right as the lower curve is for 54 subcarriers at 135 Mbps.

For 3 TX interleaving, the cycle is over three bits, e.g., $k_0=0, 3, 6, \ldots, k_1=1, 4, 7, \ldots, k_2=2, 5, 8, \ldots$. For 4 TX interleaving, the cycle is over four bits, e.g., $k_0=0, 4, 8, \ldots, k_1=1, 5, 9, \ldots, k_2=2, 6, 10, \ldots, k_3=3, 7, 11, \ldots$. Example $I_{DEPTH}$ and $D_n$ values for the cases of 3 and 4 transmitters might be $D_0=0, D_1=8, D_2=16, D_3=24$ and $I_{DEPTH}=8$.

Figure 12:
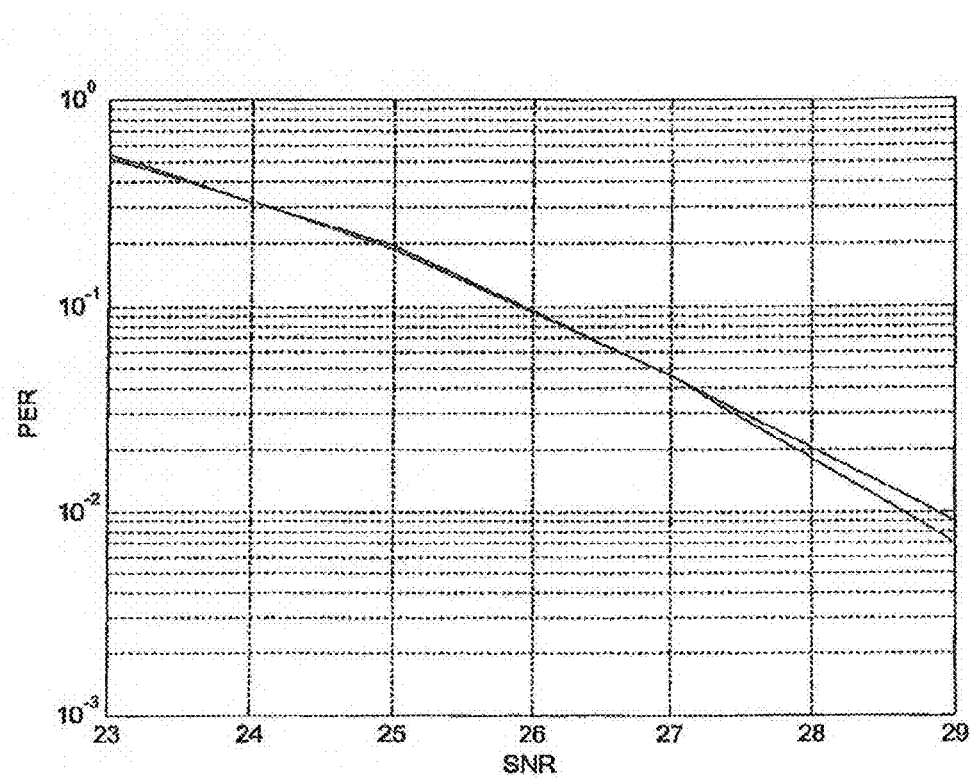
FIG. 12 is a plot of SNR v. PER for various interleaving schemes.

FIG. 12 is a plot of SNR v. PER for various interleaving schemes for 3×3, rate ½, 64-QAM, Channel D-NLOS, where the curve that ends at the right as the higher curve is for 48 subcarriers at 108 Mbps and the curve that ends at the right as the lower curve is for 54 subcarriers at 121.5 Mbps.

Figure 13:
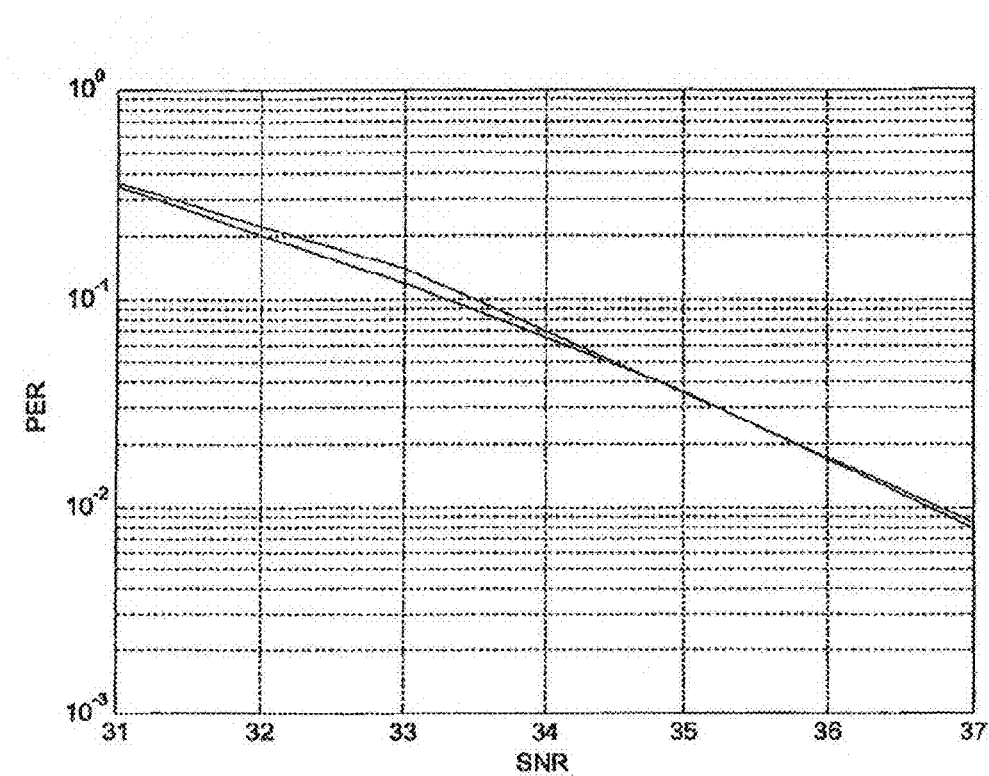
FIG. 13 is a plot of SNR v. PER for various interleaving schemes.

FIG. 13 is a plot of SNR v. PER for various interleaving schemes for 4×4, rate ¾, 64-QAM, Channel D-NLOS, where the curve that is the lower curve at SNR=33 is for 48 subcarriers at 216 Mbps and the curve that is the higher curve at SNR=33 is for 54 subcarriers at 243 Mbps.

Figure 14:
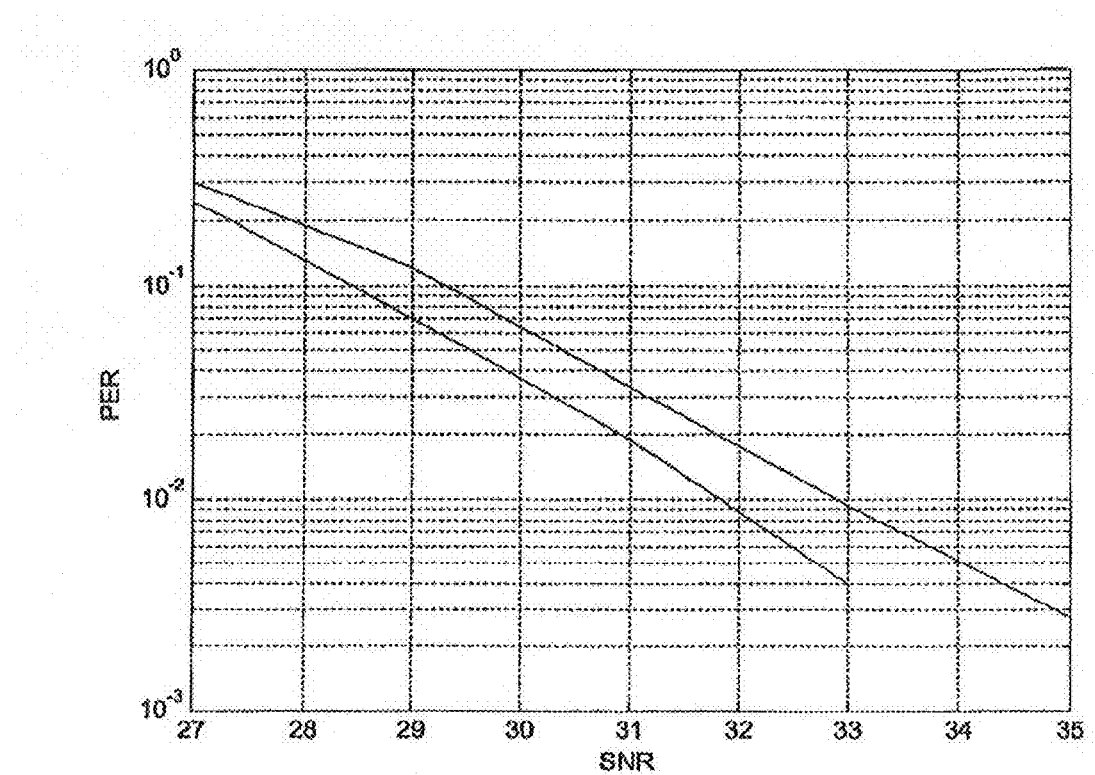
FIG. 14 is a plot of SNR v. PER for various interleaving schemes.

FIG. 14 is a plot of SNR v. PER for various interleaving schemes for 40 MHz Mode, 2×2, rate ¾, 64-QAM, Channel D-NLOS, where the upper curve is for 54 subcarriers at 121.5 Mbps and the lower curve is for 108 subcarriers at 243 Mbps.

Figure 15:
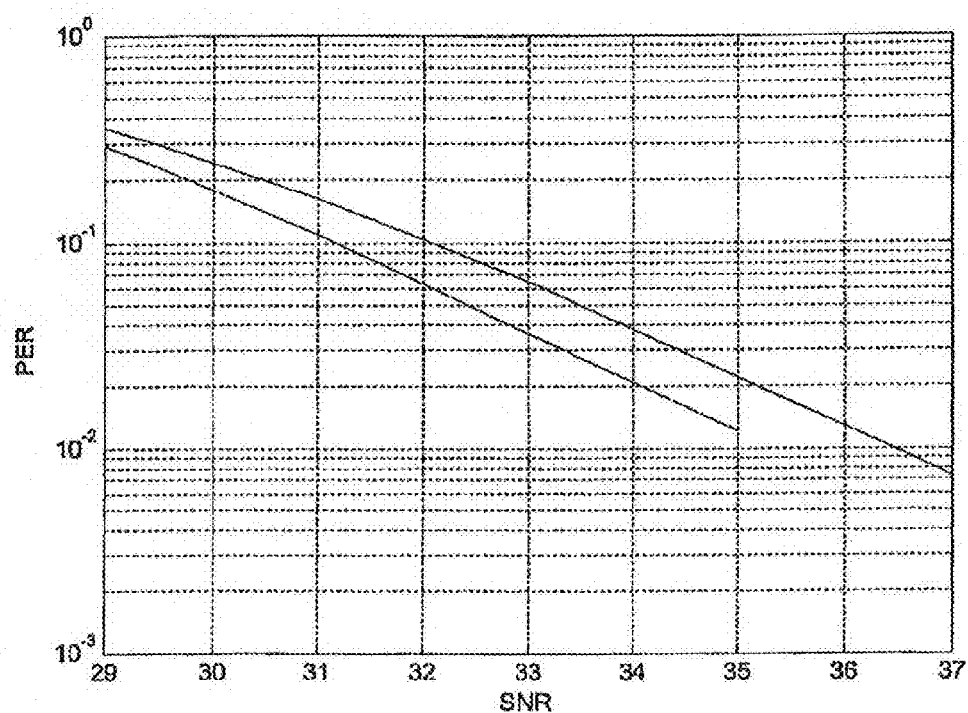
FIG. 15 is a plot of SNR v. PER for various interleaving schemes.

FIG. 15 is a plot of SNR v. PER for various interleaving schemes for 40 MHz Mode, 2×2, rate ⅚, 64-QAM, Channel D-NLOS, where the upper curve is for 54 subcarriers at 135 Mbps and the lower curve is for 108 subcarriers at 270 Mbps.

Figure 16:
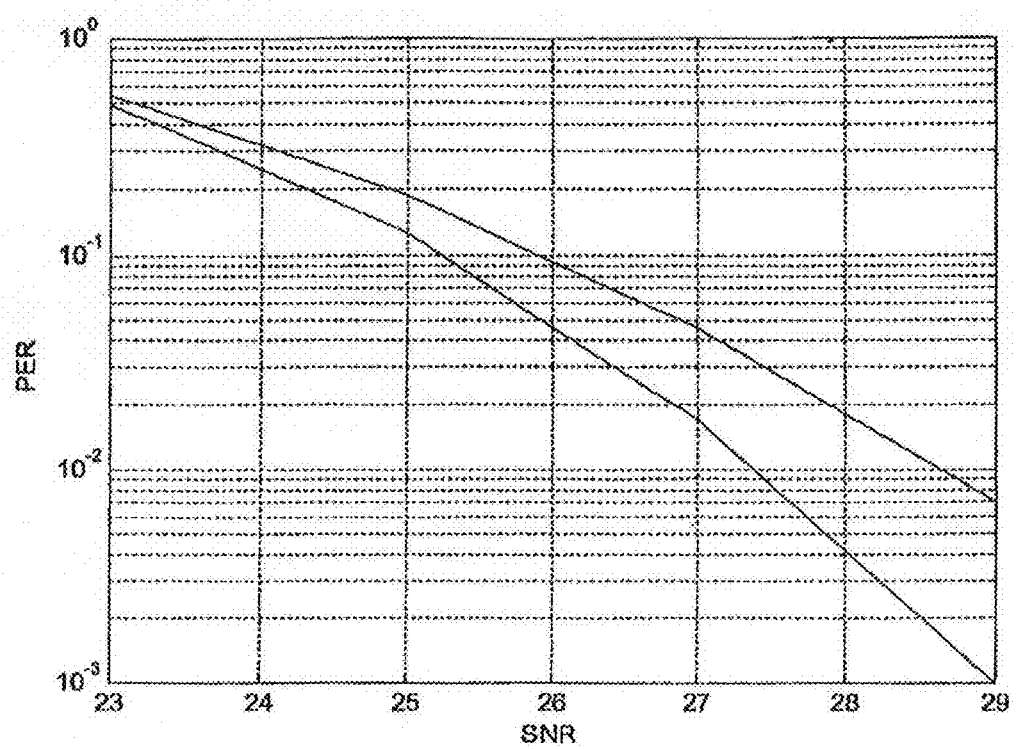
FIG. 16 is a plot of SNR v. PER for various interleaving schemes.

FIG. 16 is a plot of SNR v. PER for various interleaving schemes for 40 MHz Mode, 3×3, rate ½, 64-QAM, Channel D-NLOS, where the upper curve is for 54 subcarriers at 121.5 Mbps and the lower curve is for 108 subcarriers at 243 Mbps.

Figure 17:
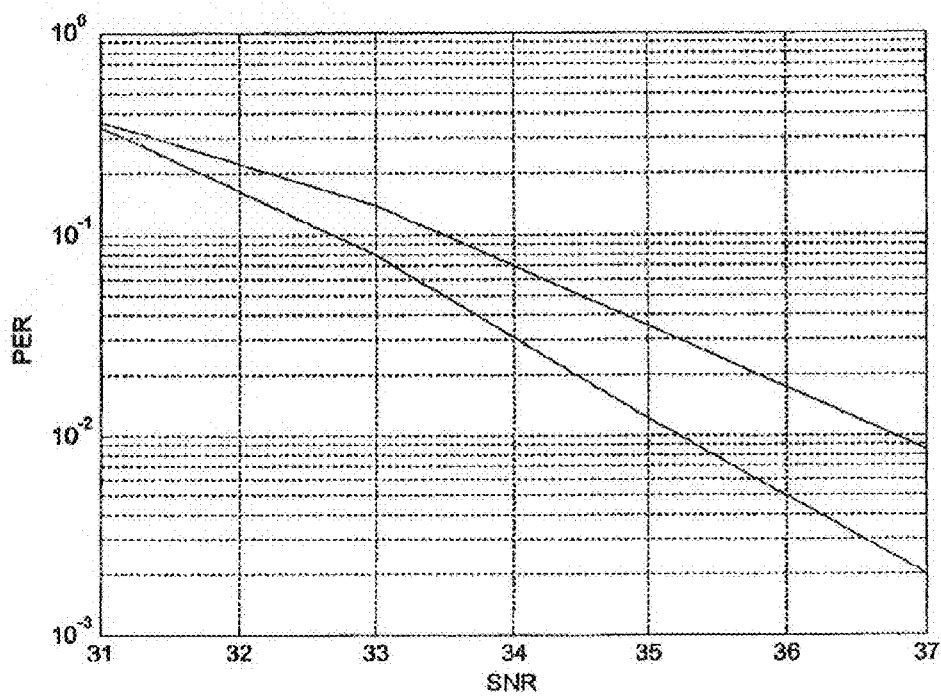
FIG. 17 is a plot of SNR v. PER for various interleaving schemes.

FIG. 17 is a plot of SNR v. PER for various interleaving schemes for 40 MHz Mode, 4×4, rate ¾, 64-QAM, Channel D-NLOS, where the upper curve is for 54 subcarriers at 243 Mbps and the lower curve is for 108 subcarriers at 486 Mbps.

Figure 18:
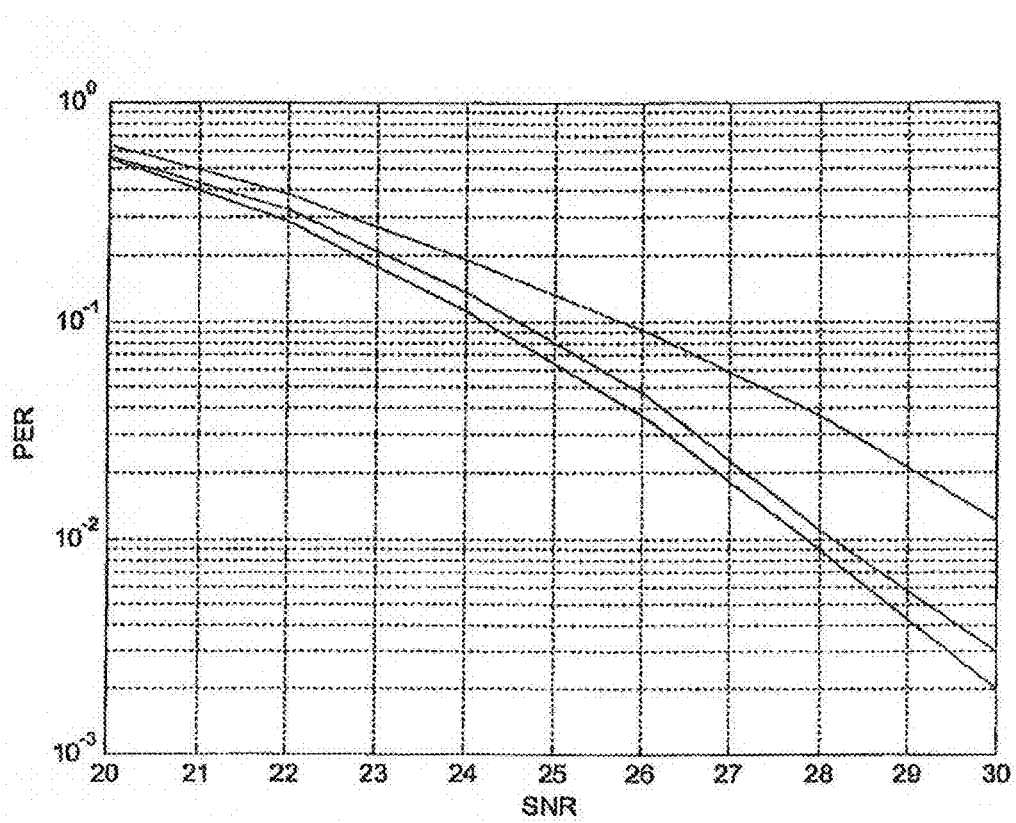
FIG. 18 is a plot of SNR v. PER for various interleaving schemes.

FIG. 18 is a plot of SNR v. PER for various interleaving schemes for 108 subcarriers in a 1×1 mode, rate ¾, 64-QAM, Channel D-NLOS. The upper curve is for $I_{DEPTH}=6$, the middle curve is for $I_{DEPTH}=18$ and the lower curve is for $I_{DEPTH}=12$.

When using 54 or 108 data subcarriers, different values should be used for $I_{DEPTH}$ and $D_n$ parameters because $(N_{CBPS}/N_{TX})/I_{DEPTH}$ should be an integer value. In one example, for 54 and 108 data subcarriers and n spatial streams:
 $I_{DEPTH}=6$ for all modes with more than 1 spatial stream
 $I_{DEPTH}=12$ for 108 subcarriers with 1 spatial stream
 $D_n=5n$ for spatial stream n Where the number of subchannels is not the same over all transmitters, or the number of bits consumed per cycle for each subchannel over all transmitters is not the same, corresponding adjustments to the interleaving described above should be apparent, upon review of this disclosure, to one of ordinary skill in the art. Thus, $N_{BPSC}$ might vary from subcarrier to subcarrier.

New interleaver parameters for 54 subcarriers give about the same SNR performance as the 48 subcarrier case, and 40 MHz modes show about 1 dB improvement, most likely due to increased frequency diversity.

The general architecture can be expanded to operate with various channel bandwidths (20 MHz, 40 MHz, etc.) and with variable number of spatial streams (1TX, 2TX, 3TX, 4TX, etc.). The 1TX version corresponds to the 802.11a interleaver (i.e., it reduces to previous standard).

In some simulations, transmitter interleaving according to transmitter interleaving #1 described above gives the better performance and has an easy implementation, as it can be exactly the standard 802.11a interleaver per transmitter, with an additional 8-subcarrier shift between TX0 and TX1. This can be used as an interleaver for a two-transmitter spatial division multiplexing mode transmitter and corresponding receiver.

While the invention has been described with respect to exemplary embodiments, one skilled in the art will recognize that numerous modifications are possible. For example, the processes described herein may be implemented using hardware components, software components, and/or any combination thereof. The invention is also not limited as to the signaling constellation, FEC encoding scheme, or number of transmit antennas or receive antennas. Where described herein, a plurality of antennas might comprise individual antennas, preferably spatially separated but not necessarily so, but a single physical antenna might be used for more than one transmit stream or receive signal through the use of polarization or other techniques.

Thus, although the invention has been described with respect to exemplary embodiments, it will be appreciated that the invention is intended to cover all modifications and equivalents within the scope of the following claims.

What is claimed is:

1. In a wireless transmitter, wherein an input bit sequence is encoded and transmitted over a wireless medium using a plurality of spatial streams each using a plurality of subcarriers, a method of interleaving comprising:
   parsing the input bit sequence to the plurality of spatial streams;
   interleaving bits parsed to a first spatial stream using a first interleaving sequence to generate a first plurality of interleaved bits, wherein the first plurality of interleaved bits consist of even bits; and
   interleaving bits parsed to a second spatial stream using a second interleaving sequence distinct from the first interleaving sequence to generate a second plurality of interleaved bits, wherein the second plurality of interleaved bits consist of odd bits, and wherein each of the plurality of spatial streams corresponds to a signal transmitted over a distinct transmit antenna.

2. The method of claim 1, wherein at least one transmit antenna carries data from more than one spatial stream.

3. In a wireless transmitter, wherein an input bit sequence is encoded and transmitted over a wireless medium using a plurality of spatial streams each using a plurality of subcarriers, a method of interleaving comprising:
   parsing the input bit sequence to the plurality of spatial streams;
   interleaving bits parsed to a first spatial stream using a first interleaving sequence to generate a first plurality of interleaved bits, wherein the first plurality of interleaved bits consist of even bits; and
   interleaving bits parsed to a second spatial stream using a second interleaving sequence distinct from the first interleaving sequence to generate a second plurality of interleaved bits, wherein the second plurality of interleaved bits consist of odd bits, and wherein the first and second interleaving sequences differ by a cyclic shift over subcarriers.

4. The method of claim 1, wherein more than one transmit antenna carries data from one spatial stream.

5. An interleaver system for use in a wireless transmitter, wherein an input bit sequence is encoded and transmitted over a wireless medium using a plurality of spatial streams each using a plurality of subcarriers, comprising:
   a parser for parsing the input bit sequence to the plurality of spatial streams;
   a first interleaver for interleaving bits parsed to a first spatial stream using a first interleaving sequence to generate a first plurality of interleaved bits, wherein the first plurality of interleaved bits consist of even bits; and
   a second interleaver for interleaving bits parsed to a second spatial stream using a second interleaving sequence distinct from the first interleaving sequence to generate a second plurality of interleaved bits, wherein the second plurality of interleaved bits consist of odd bits, and wherein each of the plurality of spatial streams corresponds to a signal transmitted over a distinct transmit antenna.

6. The interleaver system of claim 5, wherein at least one transmit antenna carries data from more than one spatial stream.

7. An interleaver system for use in a wireless transmitter, wherein an input bit sequence is encoded and transmitted over a wireless medium using a plurality of spatial streams each using a plurality of subcarriers, comprising:
   a parser for parsing the input bit sequence to the plurality of spatial streams;
   a first interleaver for interleaving bits parsed to a first spatial stream using a first interleaving sequence to generate a first plurality of interleaved bits, wherein the first plurality of interleaved bits consist of even bits; and
   a second interleaver for interleaving bits parsed to a second spatial stream using a second interleaving sequence distinct from the first interleaving sequence to generate a second plurality of interleaved bits, wherein the second plurality of interleaved bits consist of odd bits, and wherein the first and second interleaving sequences differ by a cyclic shift over subcarriers.

8. The interleaver system of claim 5, wherein more than one transmit antenna carries data from one spatial stream.

9. The interleaver system of claim 5, wherein at least one of the parser, the first interleaver, and the second interleaver comprises a software module.

10. An interleaver system for use in a wireless transmitter, wherein an input bit sequence is encoded and transmitted over a wireless medium using a plurality of spatial streams each using a plurality of subcarriers, comprising:
    means for parsing the input bit sequence to the plurality of spatial streams;
    means for interleaving bits parsed to a first spatial stream using a first interleaving sequence to generate a first plurality of interleaved bits, wherein the first plurality of interleaved bits consist of even bits; and
    means for interleaving bits parsed to a second spatial stream using a second interleaving sequence distinct from the first interleaving sequence to generate a second plurality of interleaved bits, wherein the second plurality of interleaved bits consist of odd bits, and wherein each of the plurality of spatial streams corresponds to a signal transmitted over a distinct transmit antenna.

11. The interleaver system of claim 10, wherein at least one transmit antenna carries data from more than one spatial stream.

12. An interleaver system for use in a wireless transmitter, wherein an input bit sequence is encoded and transmitted over a wireless medium using a plurality of spatial streams each using a plurality of subcarriers, comprising:
    means for parsing the input bit sequence to the plurality of spatial streams;
    means for interleaving bits parsed to a first spatial stream using a first interleaving sequence to generate a first plurality of interleaved bits, wherein the first plurality of interleaved bits consist of even bits; and
    means for interleaving bits parsed to a second spatial stream using a second interleaving sequence distinct from the first interleaving sequence to generate a second plurality of interleaved bits, wherein the second plurality of interleaved bits consist of odd bits, and wherein the first and second interleaving sequences differ by a cyclic shift over subcarriers.

13. The interleaver system of claim 10, wherein more than one transmit antenna carries data from one spatial stream.

14. The interleaver system of claim 10, wherein at least one of the means for parsing and the means for interleaving comprises a software module.

15. In a wireless transmitter, wherein an input bit sequence is encoded and transmitted over a wireless medium using a plurality of spatial streams each using a plurality of subcarriers, a machine-readable storage medium encoded with instructions executable to perform interleaving operations, the operations comprising:

parsing the input bit sequence to the plurality of spatial streams;

interleaving bits parsed to a first spatial stream using a first interleaving sequence to generate a first plurality of interleaved bits, wherein the first plurality of interleaved bits consist of even bits; and interleaving bits parsed to a second spatial stream using a second interleaving sequence distinct from the first interleaving sequence to generate a second plurality of interleaved bits, wherein the second plurality of interleaved bits consist of odd bits, and wherein each of the plurality of spatial streams corresponds to a signal transmitted over a distinct transmit antenna.

16. The machine-readable storage medium of claim 15, wherein at least one transmit antenna carries data from more than one spatial stream.

17. In a wireless transmitter, wherein an input bit sequence is encoded and transmitted over a wireless medium using a plurality of spatial streams each using a plurality of subcarriers, a machine-readable storage medium encoded with instructions executable to perform interleaving operations, the operations comprising:

parsing the input bit sequence to the plurality of spatial streams;

interleaving bits parsed to a first spatial stream using a first interleaving sequence to generate a first plurality of interleaved bits, wherein the first plurality of interleaved bits consist of even bits; and interleaving bits parsed to a second spatial stream using a second interleaving sequence distinct from the first interleaving sequence to generate a second plurality of interleaved bits, wherein the second plurality of interleaved bits consist of odd bits, and wherein the first and second interleaving sequences differ by a cyclic shift over subcarriers.

18. The machine-readable storage medium of claim 15, wherein more than one transmit antenna carries data from one spatial stream.

* * * * *